(12) United States Patent
Albrecht et al.

(10) Patent No.: US 7,525,109 B2
(45) Date of Patent: Apr. 28, 2009

(54) METHOD FOR WRITING A LARGE-AREA CLOSED CURVILINEAR PATTERN WITH A CARTESIAN ELECTRON BEAM WRITING SYSTEM

(75) Inventors: Thomas R. Albrecht, San Jose, CA (US); Zvonimir Bandic, San Jose, CA (US); Michael J. Rooks, Briarcliff Manor, NY (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 421 days.

(21) Appl. No.: 11/403,795

(22) Filed: Apr. 12, 2006

(65) Prior Publication Data
US 2007/0241291 A1 Oct. 18, 2007

(51) Int. Cl.
*H01J 37/302* (2006.01)
(52) U.S. Cl. ........................ 250/492.22; 430/30; 360/75
(58) Field of Classification Search ............. 250/492.22
See application file for complete search history.

(56) References Cited
U.S. PATENT DOCUMENTS
4,789,945 A * 12/1988 Niijima ....................... 430/30
5,798,528 A * 8/1998 Butsch et al. ............ 250/492.2
6,466,385 B1 * 10/2002 Umeda et al. .................. 360/16
2004/0135101 A1 * 7/2004 Masuda et al. ......... 250/492.22

* cited by examiner

*Primary Examiner*—David A. Vanore
*Assistant Examiner*—Phillip A. Johnston
(74) *Attorney, Agent, or Firm*—Thomas R. Berthold

(57) ABSTRACT

A method for operating a Cartesian-type electron beam (e-beam) lithography (EBL) tool enables the efficient and precise writing of a closed curvilinear pattern, such as a circle, over a wide area of a workpiece. The curvilinear pattern overlies a plurality of contiguous fields of the EBL tool's x-y positioning stage, and the stage is moved along a path defined by the contiguous fields. Alignment marks associated with the first and next-to-last fields are formed on the specimen. The alignment marks are used to adjust the shape of the last field so that when the e-beam is scanned in the last field there is a substantially continuous connection of the pattern between the next-to-last field and the first field. The invention is particularly applicable to making a master disk with concentric circular tracks for nanoimprinting patterned magnetic recording disks.

7 Claims, 4 Drawing Sheets

Transformation for Field m:

$$x' = x + (xy/a_2)\Delta x_1 + [x(a-y)/a_2]\Delta x_2$$
$$y' = y + (xy/a_2)\Delta y_1 + [x(a-y)/a_2]\Delta y_2$$

Alternative Transformation for Field m:

$$x' = x$$
$$y' = y + (xy/a_2)\Delta y_1 + [x(a-y)/a_2]\Delta y_2$$

METHOD FOR WRITING A LARGE-AREA CLOSED CURVILINEAR PATTERN WITH A CARTESIAN ELECTRON BEAM WRITING SYSTEM

BACKGROUND OF THE INVENTION

1. Field of the Invention

This invention relates generally to electron beam lithography (EBL), and more particularly to an EBL method for writing a curvilinear pattern over a large area with minimal accumulation of errors.

2. Description of the Related Art

EBL is a specialized technique for creating extremely fine patterns on a workpiece or specimen, such as a semiconductor wafer. In EBL, the specimen is covered with a resist film that is sensitive to the electrons and is moved across the electron beam (e-beam). The primary advantage of EBL is that it overcomes the diffraction limit of light and enables the patterning of features in the nanometer range. EBL has has yet to become a standard manufacturing technique because of its slow speed. Because the e-beam must be scanned across the surface to be patterned, typically raster-scanned in an x-y Cartesian coordinate system, the pattern generation is serial. This makes for very slow pattern generation compared with a parallel technique like conventional photolithography in which the entire surface of the specimen is patterned at once. As a result, EBL is used mainly to generate exposure masks to be used with conventional photolithography. For commercial applications, EBL is usually produced using dedicated e-beam tools or writing systems, such as those available from Leica Microsystems and Hitachi, Ltd.

Commercial e-beam writing systems use an x-y stage that moves the specimen in a Cartesian coordinate system in a plane orthogonal to the incident e-beam. The stage is divided into square fields in the x-y coordinate system and is moved in a raster technique from field to field in the x and y directions so that fields of the specimen are successively positioned under the e-beam. After a specific field has been positioned, the e-beam is scanned across subfields within that field to write the portion of the pattern within that field. These e-beam writing systems work well for their primary application, the patterning of semiconductor masks, wherein the entire specimen contains a large number of relatively small identical patterns corresponding to the individual semiconductor chips and the patterns contain a large number of straight lines. However, it becomes difficult to use these systems to write closed curvilinear patterns such as circles, and particularly circular patterns that extend over a large area of the entire specimen. This is because errors in movement of the stage from field to field accumulate so that the last portion of the circular pattern does not correlate with the first portion.

One application for e-beam writing of large-area circular patterns is for patterned magnetic recording disks. Magnetic recording hard disk drives with patterned magnetic recording disks have been proposed to increase data density. In a patterned disk, the magnetic recording layer on the disk is patterned into small isolated data islands arranged in concentric circular data tracks. Patterned disks also have nondata regions that are used for servo positioning of the read/write heads in the data tracks. To achieve patterned disks with areal data densities greater than about 300 Gbit/in$^2$, the pattern period is typically below about 50 nm along-the-track and the diameter of the data islands is below about 30 nm. One proposed method for fabricating patterned disks with such extremely small features is by nanoimprinting with a master disk or "stamper" having a topographic surface pattern. In this method the magnetic recording disk substrate with a polymer film on its surface is pressed against the master disk. The polymer film receives the image of the master disk pattern and then becomes a mask for subsequent etching of the disk substrate. The magnetic layer and other layers needed for the magnetic recording disk are then deposited onto the etched disk substrate to form the patterned-media disk. The master disk for nanoimprinting can be fabricated by EBL provided the circular patterns can be written with high precision.

What is needed is an e-beam writing method for commercial Cartesian-type EBL systems that enables closed curvilinear patterns, in particular concentric circular patterns, to be written over relatively large areas without accumulation of errors caused by movement of the x-y stage from field to field.

SUMMARY OF THE INVENTION

The invention is a method for operating a Cartesian-type EBL tool to efficiently and precisely write a closed curvilinear pattern, such as a circle, over a wide area of a workpiece. The curvilinear pattern overlies a plurality of contiguous fields of the x-y stage, and the stage is moved along a path defined by the contiguous fields. Alignment marks associated with the first and next-to-last fields are formed on the specimen. The alignment marks are used to adjust the shape of the last field so that when the e-beam is scanned in the last field there is a substantially continuous connection of the pattern between the next-to-last field and the first field. The alignment marks for the first and next-to-last fields may each be the vertices of square. The shape of the last field is adjusted by calculating the x and y offsets between the vertices of the two squares. The calculated offsets are used to correct the scanning of the e-beam in the last field so that the continuous pattern connection is achieved. The invention is particularly applicable to making a master disk with concentric circular tracks for nanoimprinting patterned magnetic recording disks.

For a fuller understanding of the nature and advantages of the present invention, reference should be made to the following detailed description taken together with the accompanying figures.

DETAILED DESCRIPTION OF THE INVENTION

Figure 1:
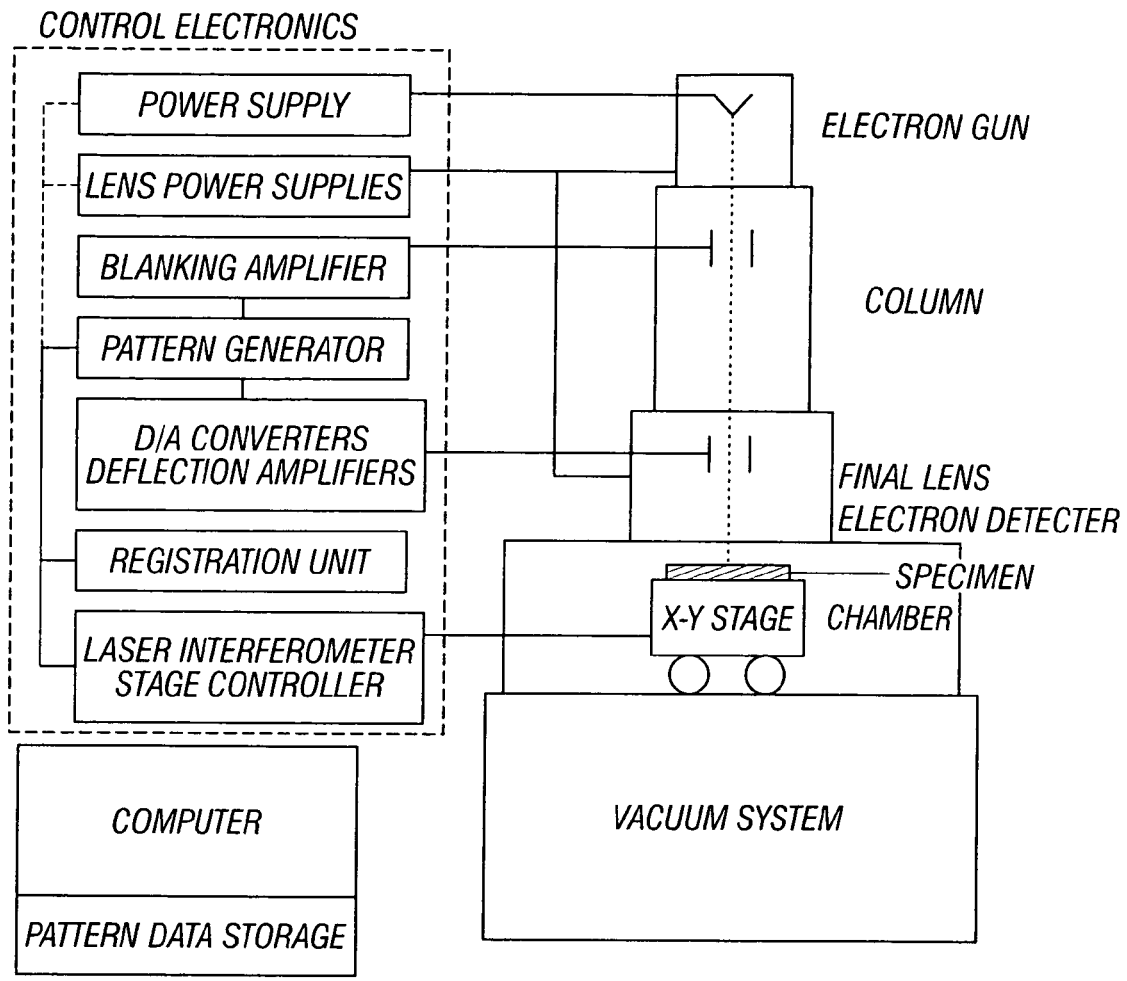
FIG. 1 is a schematic of a conventional EBL system.

FIG. 1 is a high-level block diagram of a typical EBL tool or writing system. The column forms and controls the e-beam. Below the column is the chamber containing the stage that supports and moves the specimen in an x-y plane orthogonal to the e-beam. A vacuum system maintains an appropriate vacuum level in the chamber. The system is controlled by the EBL computer that controls functions such as loading and unloading the specimen, focusing the e-beam, blanking (turning the e-beam on and off), aligning the e-beam with the specimen, and sending pattern data to the pattern generator. The EBL computer drives a set of control electronics that supplies power and signals to the various parts of the system.

The user first lays out the pattern with commercially available computer-aided-design (CAD) software. The CAD software converts the pattern to a standard exchange intermediate file format, such as GDSII. The EBL computer converts the intermediate format to a format specific to the EBL tool so that the stage and e-beam are controlled to write the pattern on the specimen. In the conventional writing approach the stage is raster scanned in the x and y directions beneath the e-beam and the e-beam is blanked as necessary to write the pattern. The EBL tool uses alignment marks that are formed on the specimen before writing the pattern. Global alignment marks are used to correct for placement and rotation of the specimen on the stage. Pattern-specific alignment marks are used to precisely locate specific portions of the pattern, such as individual chips on a semiconductor wafer. The alignment marks are detected by the system and the EBL computer then calculates the adjustment required when moving the stage and scanning the e-beam.

Figure 2:
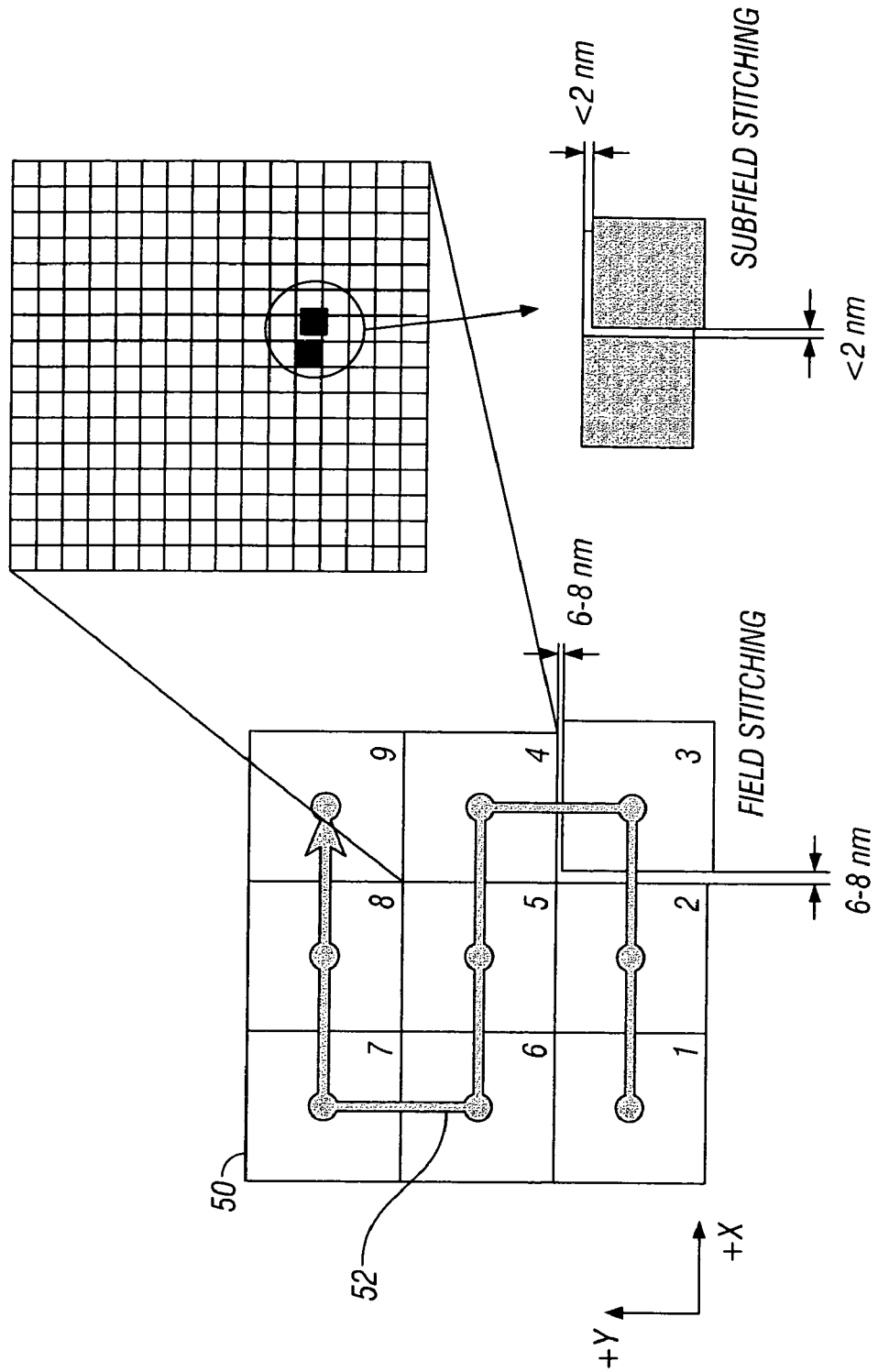
FIG. 2 is a portion of a conventional EBL system x-y stage showing several fields and the raster technique for movement from field to field, with one field enlarged to show its subfields.

FIG. 2 shows a portion 50 of a conventional EBL system x-y stage with several square fields numbered 1 through 9. The stage is moved in a raster fashion, as shown by path 52, along the +x direction to successive square-shaped fields 1, 2, 3, then in the +y direction to field 4, then in the −x direction to fields 5, 6, then in the +y direction to field 7, and then in the +x direction to fields 8 and 9. If there is no portion of the pattern within a field, the e-beam is "blanked" when that field is beneath the e-beam. An actual system may typically contain up to several tens of thousands of fields, with each field having typical dimensions of up to 1200×1200 microns. As shown by the gap between fields 2, 3 and 4, there may be an error in positioning from one field to the next successive field, which would cause an error in "stitching" the pattern from one field to the next field. Typically this error may be very small, e.g., with the standard deviation σ of error being in the 6-8 nm range, but the errors can accumulate to an unacceptable level as the stage is moved across a large area of the specimen. FIG. 2 also illustrates an enlargement of typical field 4. Each field contains a number of square subfields, typically 64×64 (or 4096) subfields. Once the specimen has been mechanically positioned so that the e-beam is aligned with the center of a field, like field 4, the e-beam is then electronically scanned across the subfields within that field. The stitching error in scanning between subfields is much less than the error between fields, e.g., with the standard deviation σ of error being in the 2-3 nm range.

Figure 3:
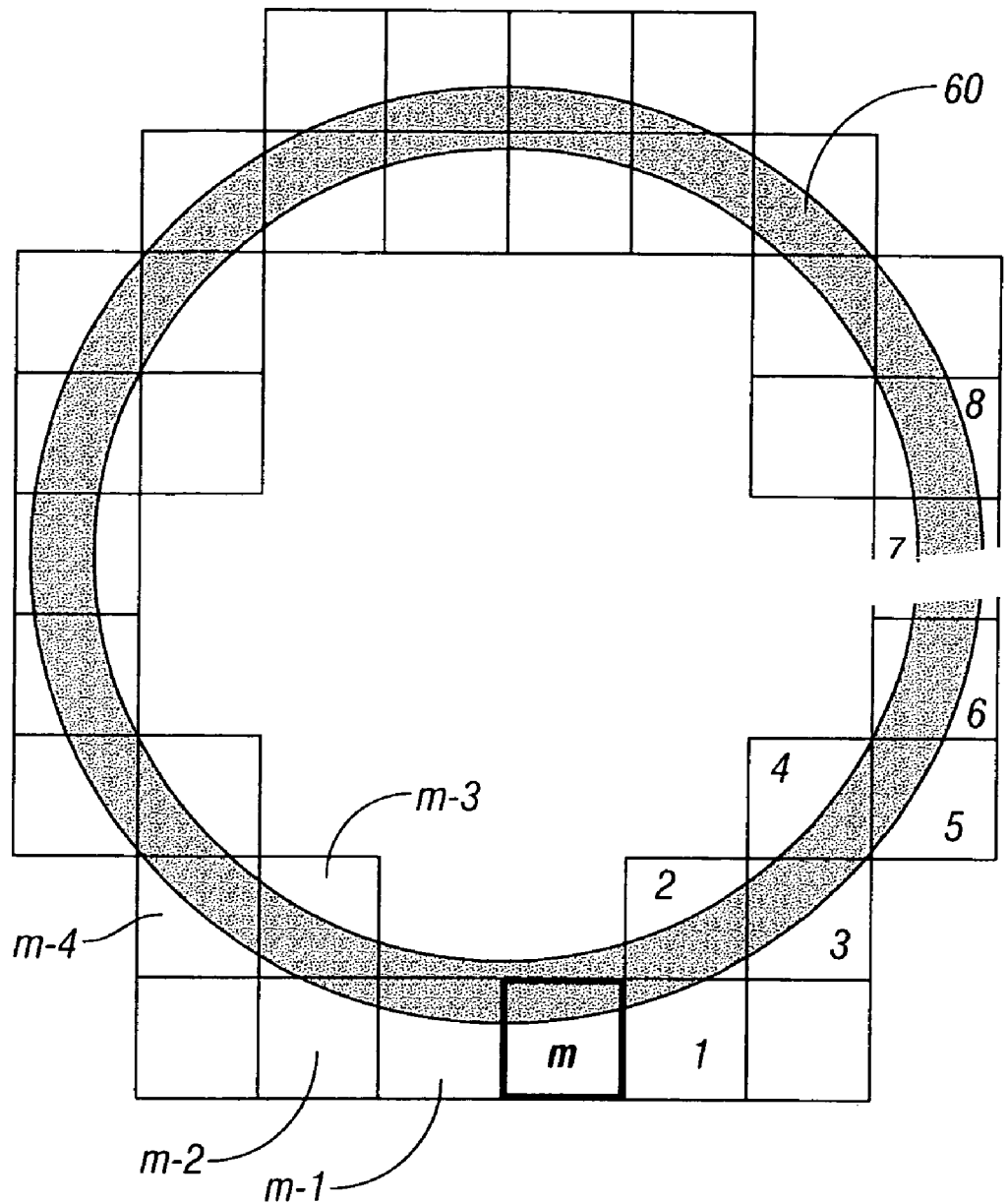
FIG. 3 is a view of a pattern defining a circular path overlying the fields of the x-y stage.

FIG. 3 shows a circular pattern 60 that may extend over a large area of the specimen. As shown in FIG. 3, a closed curvilinear pattern (circular pattern 60) and the fields it overlies are not to scale so that the invention and the problem it addresses can be better illustrated. The pattern 60 defines a circular path that overlies a plurality of m contiguous fields. These fields include the first field 1 and successive contiguous fields 2-8 near the beginning of the circular pattern 60, and contiguous fields m−3, m−2, m−1 and last field m at the end of the pattern 60. In this invention the pattern 60 is written not by conventional raster type movement of the x-y stage but by movement of the stage to successive contiguous fields in the circular pattern 60. This reduces the writing time as well as reducing the accumulation of stitching errors that would occur if the stage were moved across all of the fields in the rastering method as described with respect to FIG. 2.

However, even with this contiguous-field movement of the stage, errors will accumulate from the very first field 1 to the last field m of the circular pattern 60 so that the portion of the pattern in the last field m will not close perfectly with the portion of the pattern in the first field. This is depicted schematically in FIG. 4 by pattern portions 80, 82. The first field (field 1) in the circular pattern 60 is shown with its alignment marks, located at or generally near the field 1 vertices 61, 62, 63, 64. The next-to-last field (field m−1) is shown with its alignment marks located at or generally near the field m−1 vertices 71, 72, 73, 74. The alignment marks are typically pre-written on the specimen. When the stage has completed its movement along the contiguous fields of the circular pattern 60 and reached field m−1, the accumulation of positioning errors has resulted in a shifting of field 1 relative to field m−1. This relative shifting or offset, indicated by $\Delta x_1$, $\Delta x_2$, $\Delta y_1$, and $\Delta y_2$, will result in the portion 80 of the pattern in the last field (field m) not being perfectly stitched to the portion 82 of the pattern in field 1.

Figures 4A, 4B, 4C:
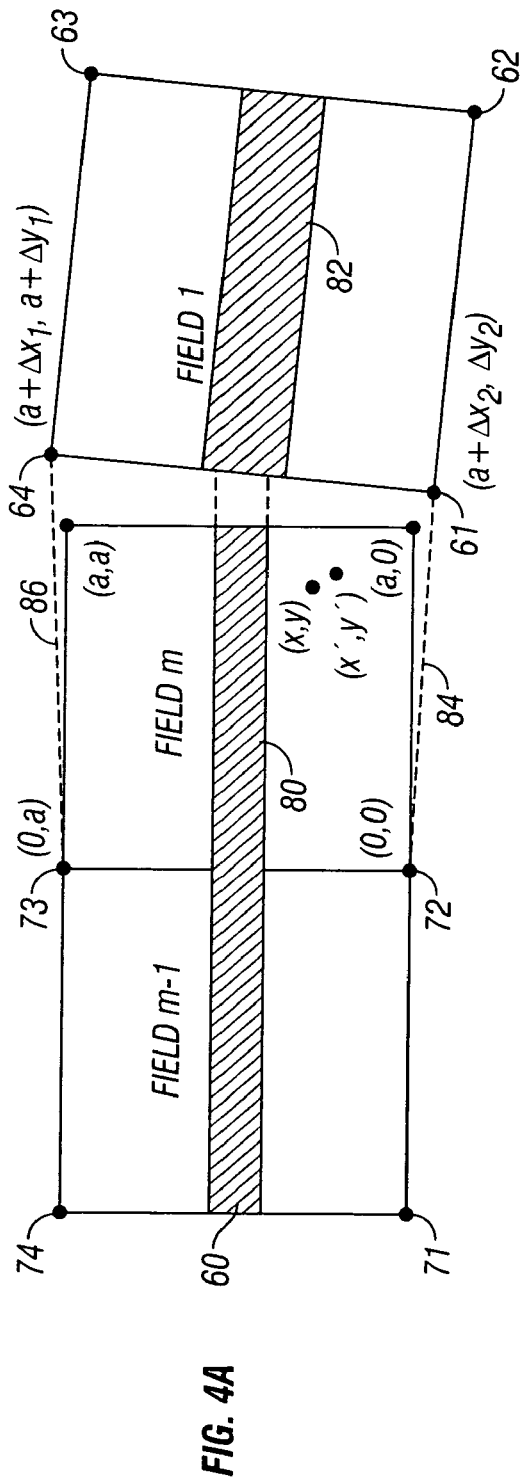
FIG. 4A is a schematic showing the first, next-to-last, and last fields (fields 1, m−1, and m, respectively) of a circular pattern to illustrate the effect of the accumulation of errors when writing to the last field.
FIG. 4B shows the method of this invention for calculating the transformed shape of the last field.
FIG. 4C shows a variation of the method for calculating the transformed shape of the last field wherein there is no calculated offset in the x direction.

In this invention alignment marks are written into a first field and also into a second that is spaced along the contiguous path from the first field by an intermediate field. The shape of the intermediate field is transformed from square to non-rectangular by measuring the offset of the alignment marks. In the example to be described the first field is field 1 (the very first field of the pattern) of m fields, the second field is field m−1 (the next-to-last field of the pattern), and the intermediate field is field m (the last field of the pattern). The shape-transformed field m will then have vertices corresponding generally to vertices 72, 61, 64, 73, so that there is generally a continuous connection between field m−1 and field 1, as shown by dashed lines 84, 86. The e-beam is then scanned in the shape-transformed field using the calculated offset. This calculated offset is shown in the box of FIG. 4A. Thus when the e-beam scans the subfields in field m, it scans to a corrected location x', y' according to the transformation calculation of FIG. 4B. This will cause pattern portion 80 to connect with pattern portion 82 in a continuous fashion.

In an alternative transformation only the y coordinates are transformed, resulting in an intentional gap between field m and field 1. The calculations for this variation are shown in the box of FIG. 4C. This variation may be desirable for forming circular tracks in a master disk for patterned magnetic recording disks to avoid a change in frequency along the track. Thus there is no calculated offset in the along-the-track or x direction.

The invention is applicable to e-beam writing of any curvilinear pattern, especially a closed curvilinear pattern that extends over a relatively large area of the specimen. The invention is particularly applicable to making a master disk for nanoimprinting patterned magnetic recording disks. The master disk has a circularly symmetric pattern of concentric tracks that can be arranged into radial groups of tracks. A group or annulus of concentric tracks is individually mastered, and between the e-beam writing of any two consecutive groups the e-beam may be automatically re-calibrated for accuracy using alignment marks. The center of symmetry for the group of concentric tracks is accurately determined using the alignment marks. This ensures that all groups are accurately positioned and centered with respect to each other. Additionally, by moving the stage around the contiguous fields of the circular path rather than by conventional rastering the stage in Cartesian coordinates, stitching errors between fields are minimized. With this method the circular pattern will accumulate errors primarily in the radial direction, which is more suitable for disk servo patterns. The method of transforming the shape of the last field in the each circular pattern and e-beam scanning of the last field minimizes the stitching error between the patterns in the next-to-last field and the first field.

The invention has been described above for transforming the last field to provide a smooth continuous pattern between the next-to-last field and the first field. However, the invention is also fully applicable to providing a continuous pattern across more fields in addition to the last field. If the misalignment between the next-to-last field and the first field is too large, and the field size is not that large, the corrected pattern may show significant distortion in the last field. If the patterns are circular tracks in a patterned magnetic recording disk, this could make it difficult or impossible for the disk drive servo system to follow the curves in the tracks where the two ends meet. To prevent this the pattern can be smoothed over more than one field when the end of the pattern is reached. Thus alignment marks can be written in each of several fields near the end of the pattern, e.g., fields m−4, m−3 and m−2, in addition to field m−1. The shape of a field, such as field m−3, would be transformed by measuring the offset of the alignment marks between fields m−4 and field m−2. The e-beam would then be scanned in the shape-transformed m−3 field using the calculated offset, in the manner as described above. This process can continue until the shape of last field m is transformed, resulting in the pattern having a continuous shape over multiple contiguous fields near the end of the pattern. This would allow the distortions within the final fields to be smaller, and increases the chance that a usable pattern can be created.

The pattern can also be smoothed over other fields along the path of contiguous fields, such as at fields distributed along a full circular track. For example if m=100, these could be fields 25, 50, 75 and 100. Alignment marks would be written in fields 24 and 26, 49 and 51, 74 and 76, and 99 and 1. These alignment marks are used to measure distortions and calculate offsets for subsequent writing of fields 25, 50, 75 and 100, respectively. The advantage of this method is that accumulation of errors will occur only on part of the full circular track (in this example only over about 90 degrees or one-fourth of the pattern), which limits the total error accumulation.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A method for writing a pattern on a specimen using an electron-beam (e-beam) tool having a positioning stage for moving the specimen in a plane substantially orthogonal to the e-beam, the positioning stage having a plurality of square-shaped fields arranged in an x-y Cartesian coordinate system and being capable of positioning each field with the e-beam, the pattern to be written defining a closed curvilinear path lying in a plurality of contiguous fields, the method comprising:

writing with the e-beam first alignment marks on the specimen at the vertices of a first square-shaped field and second alignment marks on the specimen at the vertices of a second square-shaped field not contiguous with the first field, the first and second fields lying in the curvilinear path;

writing the portion of the pattern lying within said first field on the specimen;

writing the portion of the pattern lying within said second field on the specimen;

adjusting, from the first and second alignment marks, the shape of an intermediate field between the first and second fields to provide a substantially continuous connection between said first and second fields by calculating the x and y offsets between the vertices of the first and second fields;

positioning the shape-adjusted intermediate field with the e-beam; and writing the portion of the pattern lying within the shape-adjusted intermediate field on the specimen by scanning the e-beam to subfields within the shape-adjusted intermediate field using the calculated offsets to locate the e-beam to the subfields to thereby connect the portion of the pattern lying within the shape-adjusted intermediate field with the portion of the pattern in the first field and the portion of the pattern in the second field.

2. The method of claim 1 wherein the shape of the intermediate field is defined by two vertices of the first square-shaped field and two vertices of the second square-shaped field.

3. The method of claim 1 wherein there are m contiguous fields, wherein the first field is field 1, wherein the second field is field m−1, and wherein the shape-adjusted intermediate field is field m, and further comprising writing a portion of the curvilinear pattern in sequence beginning with field 1 and continuing to field m−1, and wherein writing the portion of the pattern lying within the shape-adjusted intermediate field m comprises connecting the portion of the pattern in field m−1 with the portion of the pattern in field 1 to thereby close the curvilinear pattern.

4. The method of claim 1 wherein the closed curvilinear pattern to be written is a circular pattern.

5. The method of claim 4 wherein the specimen is a master disk for nanoimprinting patterned-media magnetic recording disks.

6. A method for writing a circular pattern on a specimen using an electron-beam (e-beam) tool having a positioning stage for moving the specimen in a plane substantially orthogonal to the e-beam, the positioning stage having a plurality of square-shaped fields arranged in an x-y Cartesian coordinate system and being capable of positioning each field with the e-beam, each field having a plurality of subfields and the pattern to be written defining a circular path lying in a plurality of contiguous fields, the method comprising:

positioning a first field of the path with the e-beam;

writing with the e-beam first alignment marks on the specimen at the vertices of the first field;

scanning the e-beam across the subfields of the first field to write the portion of the pattern lying within said first field;

successively positioning contiguous fields of the path with the e-beam and for each contiguous field scanning the e-beam across the subfields to write the portion of the pattern lying within said contiguous field;

positioning the next-to-last field of the path with the e-beam;

writing with the e-beam second alignment marks on the specimen at the vertices of the next-to-last field;

scanning the e-beam across the subfields of the next-to-last field to write the portion of the pattern lying within the next-to-last field;

calculating, from the first and second alignment marks, x and y offsets between the vertices of the first and next-to-last fields, the shape of the last field being defined by two vertices of the first field and two vertices of the next-to-last field; and scanning the e-beam across the subfields of the last field using the calculated x and y offsets to write the portion of the pattern lying within the last field to provide a substantially continuous connection of the portion of the pattern written in the next-to-last field with the portion of the pattern written in the first field.

7. The method of claim 6 wherein the specimen is a master disk for nanoimprinting patterned-media magnetic recording disks.

* * * * *